US010411458B2

(12) United States Patent
Cheng et al.

(10) Patent No.: US 10,411,458 B2
(45) Date of Patent: Sep. 10, 2019

(54) OVERVOLTAGE PROTECTION DEVICE (71) Applicant: ALi Corporation, Hsinchu (TW)

(72) Inventors: Ching-Chung Cheng, Taipei (TW); Kuo-Kai Lin, Taipei (TW)

(73) Assignee: ALi Corporation, Hsinchu (TW)

( * ) Notice: Subject to any disclaimer, the term of this patent is extended or adjusted under 35 U.S.C. 154(b) by 269 days.

(21) Appl. No.: 15/457,068

(22) Filed: Mar. 13, 2017

(65) Prior Publication Data

US 2017/0346273 A1 Nov. 30, 2017

(30) Foreign Application Priority Data

May 26, 2016 (CN) .......................... 2016 1 0355692

(51) Int. Cl.
*H02H 3/20* (2006.01)
*H02H 7/20* (2006.01)
*H01R 13/00* (2006.01)

(52) U.S. Cl.
CPC ............... *H02H 3/20* (2013.01); *H01R 13/00* (2013.01); *H02H 7/20* (2013.01)

(58) Field of Classification Search
CPC ................................. H02H 9/04; H02H 9/041
USPC ................................................. 361/91.1–91.5
See application file for complete search history.

(56) References Cited

U.S. PATENT DOCUMENTS

| 5,872,473 A * | 2/1999 | Williams ......... H03K 19/00361 327/108 |
| 5,973,483 A | 10/1999 | Jo |
| 8,395,433 B2 | 3/2013 | Rien et al. |
| 2015/0171830 A1 | 6/2015 | Low et al. |

FOREIGN PATENT DOCUMENTS

| CN | 101931220 | 12/2010 |
| CN | 102111070 | 6/2011 |
| CN | 102177643 | 9/2011 |
| CN | 102195265 | 9/2011 |
| CN | 103166623 | 6/2013 |

OTHER PUBLICATIONS

"Office Action of China Counterpart Application," dated Feb. 1, 2019, p. 1-p. 7.

* cited by examiner

*Primary Examiner* — Dharti H Patel
(74) *Attorney, Agent, or Firm* — J.C. Patents (57) ABSTRACT

An overvoltage protection device including an output stage, a first switch and a first load providing circuit is provided. The output stage has a first input terminal to receive a first signal, and generates an output signal at an output terminal of the output stage according to the first signal. A first terminal of the first switch is coupled to the first input terminal of the output stage, and a control terminal of the first switch receives a second signal. The first signal is the delayed second signal. The first load providing circuit is coupled to a second terminal of the first switch. The first load providing circuit provides an impedance to the first input terminal when the first switch is turned on.

13 Claims, 8 Drawing Sheets

OVERVOLTAGE PROTECTION DEVICE

CROSS-REFERENCE TO RELATED APPLICATION

This application claims the priority benefit of China application serial no. 201610355692.0, filed on May 26, 2016. The entirety of the above-mentioned patent application is hereby incorporated by reference herein and made a part of this specification.

BACKGROUND OF THE INVENTION

Field of the Invention

The invention relates to an overvoltage protection technique for electronic equipment, and particularly relates to an overvoltage protection device applied to a universal serial bus (USB) interface.

Description of Related Art

Universal serial bus (USB) interface supports functions of hot plug-in and plug-and-play. Since the advent of the USB interface, the USB interface has been widely applied to various electronic products, for example, USB storage devices, mobile phones, printers, personal computers, etc., and has become a mainstream interface for data exchange between various devices. Particularly, the USB storage device almost becomes indispensable computer peripheral equipment for everyone.

Along with increase of data amount and development of technology, the USB interface continues to update standard specifications thereof. For example, in the current specification, the lower access voltage of the USB is between 0.0V and 0.3V, and the higher USB access voltage is between 2.8V and 3.6V. However, a control chip in a storage device connected to the USB interface is probably fabricated by a semiconductor process driven by an operating voltage of 1.8V, and is required to output a high voltage (for example, 2.8V to 3.6V) greater than 1.8V, so that an overvoltage protection circuit in the storage device often requires to sustain an overvoltage.

Although the storage device may still keep working in a normal operation under a design of an integrated circuit, if it suffers the overvoltage in long term, a lifetime of the overvoltage protection circuit in the storage device can be greatly decreased. In an actual application, if a gate-source voltage (Vgs) of a metal oxide semiconductor (MOS) transistor adopted by the overvoltage protection circuit in the storage device is smaller than a negative 2.05V (for example, Vgs is −2.145V), the storage device probably has an average lifetime and reliability for about 5 years. Comparatively, if the Vgs of the MOS transistor in the overvoltage protection circuit is a positive 2.145V, the storage device probably only has the average lifetime and reliability for about 1.68 years. Besides the requirement of voltage section, the circuit of the USB interface is further required to satisfy a specification of a voltage slew rate. The voltage slew rate is a voltage changing rate within a unit of time interval, and the greater the voltage slew rate is, the easier an electromagnetic interference (EMI) is caused.

Therefore, it is an important issue to avoid the storage device and the electronic components to be under the overvoltage for long term, and meanwhile make the overvoltage protection circuit of the USB interface to be complied with the aforementioned situation.

SUMMARY OF THE INVENTION

The invention is directed to an overvoltage protection device, which is adapted to avoid overvoltage of an electronic apparatus using a universal serial bus (USB) and corresponding electronic components, so as to prolong lifetime of the electronic apparatus and the electronic components.

The invention provides an overvoltage protection device including an output stage, a first switch and a first load providing circuit. The output stage has a first input terminal to receive a first signal, and generates an output signal at an output terminal of the output stage according to the first signal. A first terminal of the first switch is coupled to the first input terminal of the output stage, and a control terminal of the first switch receives a second signal. The first signal is the delayed second signal. The first load providing circuit is coupled to a second terminal of the first switch. The first load providing circuit provides an impedance to the first input terminal when the first switch is turned on.

According to the above description, in the overvoltage protection device of the invention, the first switch and the first load providing circuit are added before the output stage. In this way, when a data signal is transmitted through the overvoltage protection device, the data signal is delayed to generate the first signal, and the second signal related to the data signal is adopted to turn on the first switch, such that the first load providing circuit is adapted to increase a input terminal impedance of the output stage when the first switch is turned on. Moreover, after the input terminal impedance is increased, the delayed first signal is transmitted to the output terminal of the output stage. In this way, a voltage slew time of the data signal is delayed when the data signal passes through the output stage, so as to avoid transient increase of the voltage to damage the electronic apparatus and the internal electronic components thereof.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
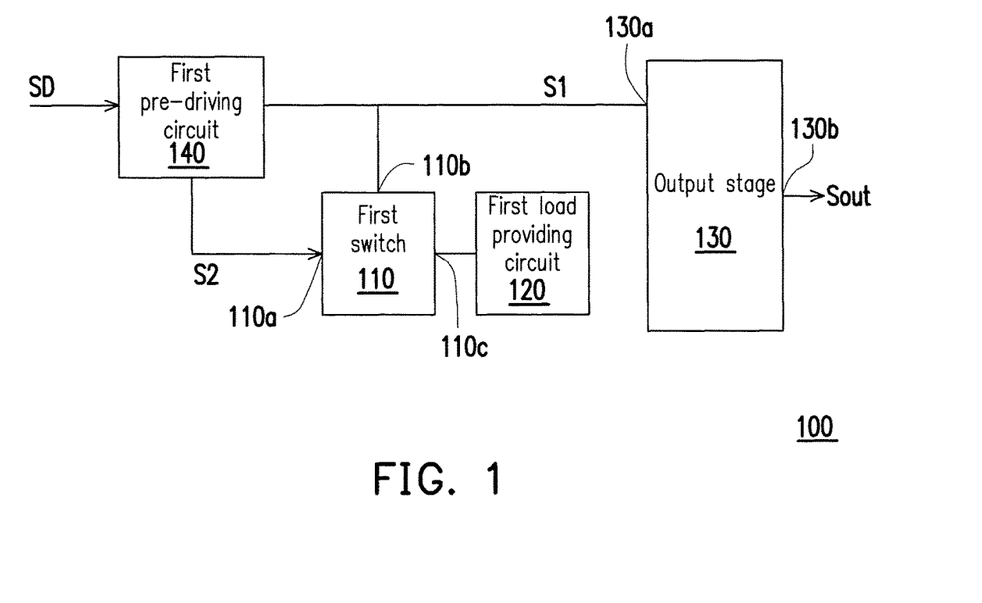
FIG. 1 is a block diagram of an overvoltage protection device according to a first embodiment of the invention.

FIG. 1 is a block diagram of an overvoltage protection device 100 according to a first embodiment of the invention. The overvoltage protection device 100 can be applied to an electronic apparatus having a universal serial bus (USB) interface, for example, a USB storage device, a mobile phone, etc. The USB storage device can be a flash drive, a hard disk drive, etc., that can use the USB interface. Referring to FIG. 1, the overvoltage protection device 100 of the present embodiment is mainly to transmit signals between different voltage levels. In the present embodiment, a voltage level of a data signal SD received by the overvoltage protection device 100 is between 0V and 1.8V, and a voltage level of an output signal Sout outputted by the overvoltage protection device 100 is between 0V and 3.3V. During a process of transmitting the data signal SD, the data signal SD can be boosted through a first pre-driving circuit 140, so as to generate a first signal S1 and a second signal S2, and an output stage 130 receives the first signal S1 and the second signal S2 to output the output signal Sout. Voltage levels of the first signal S1 and the second signal S2 of the present embodiment are between 1.8V and 3.3V, those skilled in the art may adjust the voltage level of the signals according to an actual requirement, so as to avoid overvoltage of various components or transistors in the overvoltage protection device 100.

In an embodiment, the overvoltage protection device 100 has a first switch 110, a first load providing circuit 120 and the output stage 130. The first switch 110 has a control terminal 110a, a first terminal 110b and a second terminal 110c. The first switch 110 controls the conduction between the first terminal 110b and the second terminal 110c of the first switch 110 according to the second signal S2 received by the control terminal 110a. For example, when the control terminal 110a receives the enabled second signal S2, it conducts the circuit between the first terminal 110b and the second terminal 110c thereof to form a conduction path. When the control terminal 110a receives the disabled second signal S2, it disables the conduction between the first terminal 110b and the second terminal 110c thereof.

The first load providing circuit 120 is coupled to the second terminal 110c of the first switch 110 to dynamically provide an impedance to a first input terminal 130a of the output stage 130. In detail, whether the first load providing circuit 120 is connected to the first input terminal 130a of the output stage 130 is controlled by the first switch 110. When the first switch 110 is turned on, the first load providing circuit 120 is directly coupled to the first input terminal 130a of the output stage 130. At this time, by using the first load providing circuit 120 to increase the impedance value of the side of the first input terminal 130a of the output stage 130, the impedance value at the side of the first input terminal 130a of the output stage 130 is temporarily increased, so as to decrease the voltage transmission speed of the first signal S1, and to delay the voltage variation of an output voltage generated at the output terminal 130b of the output stage 130.

The output stage 130 receives the first signal S1 through the first input terminal 130a, and generates the output signal Sout at the output terminal 130b of the output stage 130. The output terminal 130b of the output stage 130 can be connected to a USB interface (for example, a USB slot of a computer host) to implement data exchange.

As shown in FIG. 1, the overvoltage protection device 100 further selectively includes the first pre-driving circuit 140. The first pre-driving circuit 140 is coupled to the first input terminal 130a of the output stage 130 and the control terminal 110a of the first switch 110, and the first pre-driving circuit 140 is used for gradually transforming the data signal SD into signals of different voltage level (for example, the first signal S1 and the second signal S2). In the present embodiment, the first pre-driving circuit 140 delays the second signal S2 to generate the first signal S1. However, in other embodiments of the invention, the spirit of the invention is met as long as an enabling pulse of the input second signal S2 can reach the first switch 110 not later than that of the first signal S1. Namely, the enabling pulse of the second signal S2 and an enabling pulse of the first signal S1 may simultaneously reach the first switch 110, or the enabling pulse of the input second signal S2 reaches the first switch 110 earlier than that of the first signal S1, which is not limited by the invention. A reason lies in that according to the spirit of the invention, the load at the input terminal of the output stage 130 is expected to be increased in advance before or at the same time when the first signal S1 reaches the first switch 110. In this way, at the moment of transition, a waveform variation of the output signal Sout at the output terminal 130b of the output stage 130 may have a flat variation. In other words, in a part of the embodiments complied with the spirit of the invention, the data signal SD (which can be referred to as a third signal) can be buffered through a buffer to produce the first signal S1, and the data signal SD itself is synchronous to the second signal S2 to implement the circuit structure having the effect to be achieved by the invention.

Figure 2:
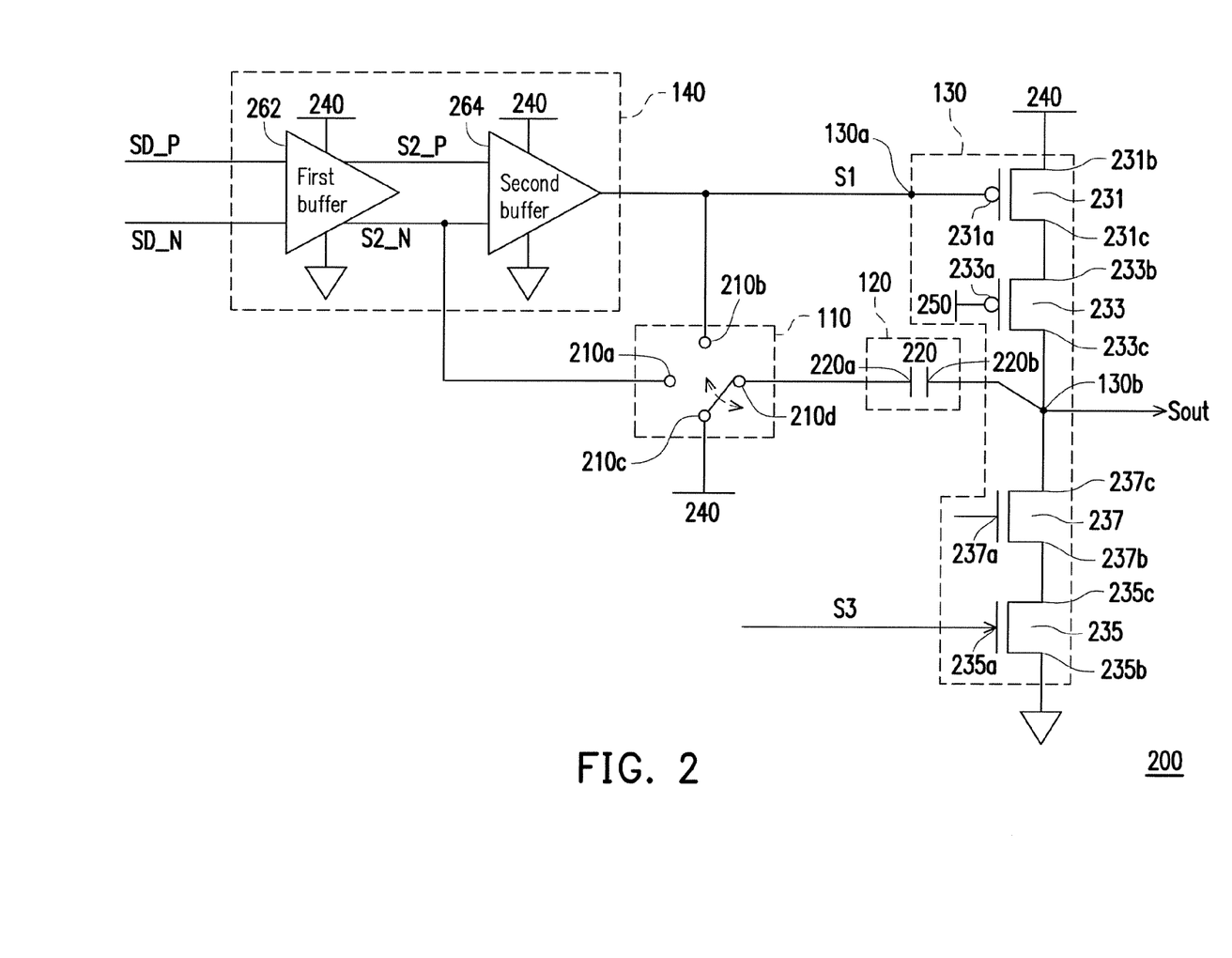
FIG. 2 is a circuit diagram of an overvoltage protection device according to the first embodiment of the invention.

FIG. 2 is a circuit diagram of an overvoltage protection device 200 according to the first embodiment of the invention. It should be noted that, referring to FIG. 2, the first pre-driving circuit 140 may include a first buffer 262 which includes double-end input and double-end output and a second buffer 264 which includes double-end input and double-end output, so that the first buffer 262 in FIG. 2 takes a positive data signal SD_P and an negative data signal SD_N inverted by the positive data signal SD_P to serve as the input signals of the first pre-driving circuit 140, the first buffer 262 in FIG. 2 also takes a positive second signal S2_P and an negative second signal S2_N inverted by the positive second signal S2_P to serve as the signals outputting to the second buffer 264. For simplicity's sake, in following descriptions, the data signal is used to represent the positive data signal SD_P and the negative data signal SD_N, and the second signal is used to represent the positive second signal S2_P and the negative second signal S2_N.

Referring to FIG. 1 and FIG. 2, the first switch 110 can be constructed by one or a plurality of metal-oxide-semiconductor field-effect transistors (MOSFETs), for example, an N-type MOSFET and/or a P-type MOSFET. In the circuit structure of the present embodiment, the first switch 110 is implemented by a switch having four terminals. The switch has a control terminal 210a (serving as the control terminal 110a of the first switch 110), a first terminal 210b (serving as the first terminal 110b of the first switch 110), a second terminal 210c (connected to a system voltage terminal) and a third terminal 210d (serving as the second terminal 110c of the first switch 110).

In an embodiment, the first load providing circuit 120 is implemented by a first capacitor 220. The first capacitor 220 has a first terminal 220a and a second terminal 220b. The first terminal 220a of the first capacitor 220 is coupled to the third terminal 210d of the first switch 110, and the second terminal 220b of the first capacitor 220 is coupled to a second terminal 233c of a second transistor 233, i.e. coupled to the output terminal 130b of the output stage 130.

Moreover, in other embodiments of the invention, the second terminal 220b of the first capacitor 220 can also be selectively not coupled to the output terminal 130b of the output stage 130, but is coupled to a second terminal 231c of a first transistor 231 or a first terminal 233b of the second transistor 233. Namely, the spirit of the invention is met as long as a coupling method of the first capacitor 220 achieves an effect of increasing the impedance at the side of the first input terminal 130a of the output stage 130, and those skilled in the art may adjust the coupling method of the capacitor according to an actual requirement without being limited by the coupling method of the invention.

The relationship between the first switch 110 and the first capacitor 220 is described in detail below. When the control terminal 210a of the first switch 110 receives the enabled negative second signal S2_N, the first terminal 210b of the first switch 110 thus electrically connected to the third terminal 210d, such that the first terminal 220a of the first capacitor 220 is directly coupled to the first input terminal 130a of the output stage 130. In this way, the first capacitor 220 may increase the impedance at the first input terminal 130a of the output stage 130 through a capacitance coupling effect. On the other hand, when the control terminal 210a of the first switch 110 receives the disabled negative second signal S2_N, the second terminal 210c of the switch 110 thus electrically connected to the third terminal 210d, and the first terminal 210b of the first switch 110 is disconnected from the third terminal 210d. Since the first terminal 220a of the first capacitor 220 is directly coupled to a system voltage terminal 240 via the second terminal 210c and the third terminal 210d of the first switch 110, the first capacitor 220 can store required charges.

The output stage 130 can be implemented by a circuit structure including a plurality of transistors connected in series. In the present embodiment, the output stage 130 is implemented by the first transistor 231 and the second transistor 233 connected in series, and a third transistor 235 and a fourth transistor 237 connected in series, though the invention is not limited thereto. The first transistor 231 and the second transistor 233 can be implemented by P-type MOS transistors, and the third transistor 235 and the fourth transistor 237 can be implemented by N-type MOS transistors. A reason of implementing the output stage 130 by using a plurality of transistors connected in series is that if a single transistor is used to implement the output stage 130, the transistor itself is probably hard to sustain a voltage difference between a control terminal thereof and an output terminal thereof or between the control terminal thereof and the system voltage, so that a plurality of transistors connected in series are used to implement the output stage 130.

A detailed circuit structure of the output stage 130 is described below. The first transistor 231 and the second transistor 233 respectively have control terminals 231a, 233a, first terminals 231b, 233b and second terminals 231c, 233c, and the first terminal 231b of the first transistor 231 is connected to the system voltage terminal 240. The second terminal 231c of the first transistor 231 is connected to the first terminal 233b of the second transistor 233. The control terminal 233a of the second transistor 233 is connected to a first bias terminal 250. The control terminal 231a of the first transistor 231 is the input terminal of the output stage 130, and the second terminal 233c of the second transistor 233 is the output terminal of the output stage 130. A control terminal 235a of the third transistor 235 may serve as another input terminal of the output stage 130 to receive a fourth signal S3. A first terminal 235b of the third transistor 235 is coupled to ground. A second terminal 235c of the third transistor 235 is coupled to a first terminal 237b of the fourth transistor 237. A control terminal 237a of the fourth transistor 237 is coupled to a second reference voltage, and a second terminal 237c of the fourth transistor 237 is connected to the second terminal 233c of the second transistor 233.

Figure 3:
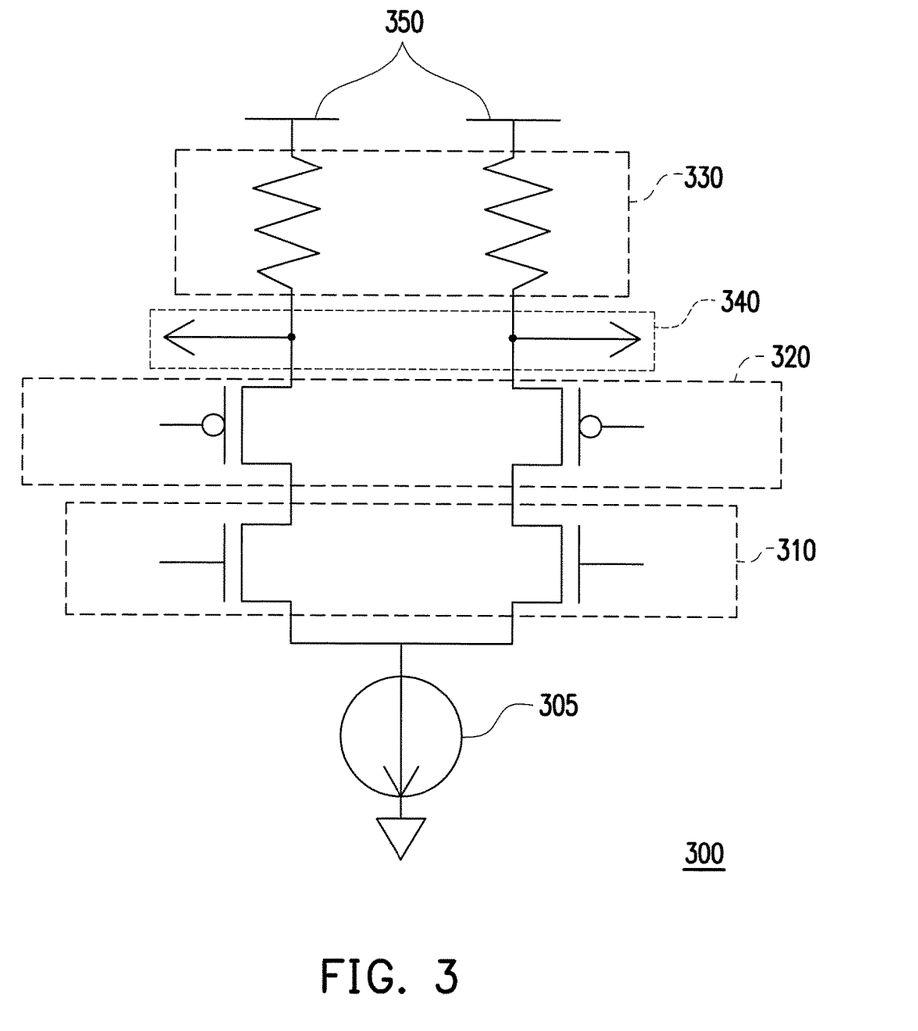
FIG. 3 is a circuit diagram of a buffer according to the first embodiment of the invention.

The first pre-driving circuit 140 of the present embodiment is implemented by the first buffer 262 and the second buffer 264. In the present embodiment, the first buffer 262 receives a third signal (for example, the positive data signal SD_P and the negative data signal SD_N) in a first voltage level (for example, 0V-1.8V) to produce a second signal (for example, the positive second signal S2_P and the negative second signal S2_N) in a second voltage level (for example, 1.8V-3.3V). The second buffer 264 is used to receive and delay the second signal (for example, the positive second signal S2_P and the negative second signal S2_N) to produce the first signal S1, where the voltage level of the first signal S1 is in the second voltage level (for example, 1.8V-3.3V). A detailed circuit structure of the first buffer 262 and the second buffer 264 of the present embodiment is disclosed with reference of FIG. 3. FIG. 3 is a circuit diagram of a buffer according to the first embodiment of the invention. The first buffer 262 and the second buffer 264 of FIG. 2 can be implemented by a differential amplifier 300 shown in FIG. 3. However, those skilled in the art may use other types of buffers or corresponding circuits to implement the buffers of the invention without being limited by the buffer structure shown in FIG. 3. It should be noted that the differential amplifier 300 of FIG. 3 has a circuit structure with double input terminals and double output terminals, so that it can be directly used to implement the first buffer 262. Those skilled in the art may also adopt the differential amplifier 300 and selectively use one of the output terminals thereof to output signals, so as to implement the second buffer 264.

Referring to FIG. 3, to be specific, the differential amplifier 300 mainly has an input transistor pair 310, a resistive element pair 330 and an output terminal pair 340. The input transistor pair 310 is connected to a reference current source 305, and provides a pair of input terminals to receive a differential signal pair (for example, the digital signals SD_P, SD_N or the second signals S2_P, S2_N). The resistive element pair 330 is respectively coupled to a bias-control transistor pair 320 and a system voltage terminal 350, and is used for producing a single-end or double-end output signal according to the differential signal pair. In the present embodiment, the resistive element pair 330 is implemented by resistors. However, in other embodiments, the resistive element pair 330 can also be implemented by MOS transistors. In other words, any resistive element can be used to implement the resistive element pair 330, which is not limited by the invention. The output terminal pair 340 is used for outputting signals. The differential amplifier 300 can be selectively configured with the bias-controlled transistor pair 320. Each of transistors in the bias-controlled transistor pair 320 is respectively coupled to the input transistor pair 310, and respectively receives a bias control voltage at a control terminal thereof, so as to avoid overvoltage.

When none signal is input to the input terminal of the differential amplifier 300, the voltage of the output terminal pair 340 is as the same as the voltage of the system voltage terminal 350, and is, for example, 3.3V in the present embodiment. When the input transistor pair 310 receives a signal input, the output terminal pair 340 may changes the output voltage due to the conduction of the circuit, and now the voltage level of the output voltage is the system voltage minus a product of current and resistance, i.e. 3.3V−I×R. Namely, through the design of the resistive element pair 330, the voltage level of the output voltage can be changed, such that the voltage level is controlled to be within a predetermined range.

It should be noted that the number of the buffers and the transformed voltage level disclosed in the present embodiment are only an example, and in an actual application, the number of the buffers can be plural, and the transformed voltage level can be different based on a circuit design consideration, and the invention is not limited thereto. For example, referring to FIG. 2, after the first signal S1 generated by the second buffer 264, the first signal S1 can be further input to another buffer to increase a time difference between the negative second signal S2_N and the first signal S1. In other words, the number of the buffers and the transformed voltage level are not limited by the invention, and the buffer circuit can be applied as long as a time of inputting the second signal S2_N to the first NMOS transistor 210 is earlier than a time of inputting the first signal S1 to the first transistor 231, and the voltage levels of the second signals S2_N, S2_P and the first signal S1 are complied with the output specifications of the output stage 130.

Referring back to FIG. 2, in the present embodiment, if an impedance (or a load) at the side of the control terminal 231a of the first transistor 231 is lower, at the moment of receiving the first signal S1, the voltage is instantly changed within the unit of time interval, i.e. a voltage slew rate is relatively huge, which is liable to cause an electromagnetic interference to the circuit at the side of the control terminal 231a of the first transistor 231. However, if the load at the side of the control terminal 231a of the first transistor 231 is excessively high, a non-linear part of the transmitted signal is increased, which may decrease signal quality. Therefore, the overvoltage protection device 200 of the present embodiment delays the data signal SD_P, SD_N in advance to produce the delayed first signal S1 and the non-delayed second signal S2 (for example, the negative second signal S2_N). The first switch 110 dynamically conducts the first terminal 210b and the third terminal 210d of the switch 110 based on whether the negative second signal S2 is enabled, so as to increase the impedance at the side of the control terminal 231a of the first transistor 231 (i.e. the impedance at the first input terminal 130a of the output stage 130) before the delayed first signal S1 is transmitted to the first transistor 231 from the second buffer 264. In this way, when the first signal S1 corresponding to the data signal passes through the first transistor 231, the voltage slew time of the first signal S1 can be effectively delayed, so as to avoid voltage transient variation to cause electromagnetic interference to internal electronic components of the electronic apparatus.

To be specific, in an embodiment, signal pulses of the negative second signal S2_N are adopted to serve as a control signal source for turning on the first terminal 210b and the third terminal 210d of the first switch 110. When the control terminal 210a of the first NMOS transistor 210 receives the second signal S2_N with a high level, the first terminal 210b and the third terminal 210d of the first switch 110 are turned on, such that the first capacitor 220 and the control terminal 231a of the first transistor 231 are in a short condition, and the first capacitor 220 may temporarily increase the impedance at the first input terminal 130a of the output stage 130. Conversely, when the control terminal 210a of the first switch 110 receives the second signal S2_N with a low level, the first terminal 210 and the third terminal 210d of the first switch 110 are in an open condition, and the second terminal 210c and the third terminal 210d of the first switch 110 are shorted. Those skilled in the art may suitably adjust the above control method according to an actual requirement, for example, the signal pulse of the positive second signal S2_P can be adopted to serve as the control signal source, though the corresponding terminals of the first switch 110 and the actuation methods thereof are required to be correspondingly adjusted.

Referring to FIG. 2, it is assumed that the impedance of the circuit at the side of the control terminal 231a of the first transistor 231 itself is ZC1, and the first capacitor 220 may provide an impedance ZC2 when the first switch 110 conducts the first terminal 210a and the third terminal 210d thereof. Therefore, when the negative second signal S2_N is disabled, the first terminal 220a of the first capacitor 220 is coupled to the system voltage terminal 240. Thus, since the first capacitor 220 and the first transistor 231 are open there between, the side of the control terminal 231a of the first transistor 231 may not receive the impedance of the first capacitor 220, and the impedance at the control terminal 231a of the first transistor 231 is ZC1. Comparatively, when the negative second signal S2_N is enabled, the first terminal 210b and the third terminal 210d of the first switch 110 are turned on, such that the first terminal 220a of the first capacitor 220 is coupled to the control terminal 231a of the first transistor 231. Now, the impedance at the side of the control terminal 231a of the first transistor 231 is ZC1+αZC2. Since the impedance at the side of the control terminal 231a of the first transistor 231 is increased, the voltage slew time of the first signal S1 passing through the first transistor 231 is delayed, so as to effectively avoid voltage transient variation to cause an electromagnetic interference to the electronic apparatus and the internal electronic components thereof.

Figure 4:
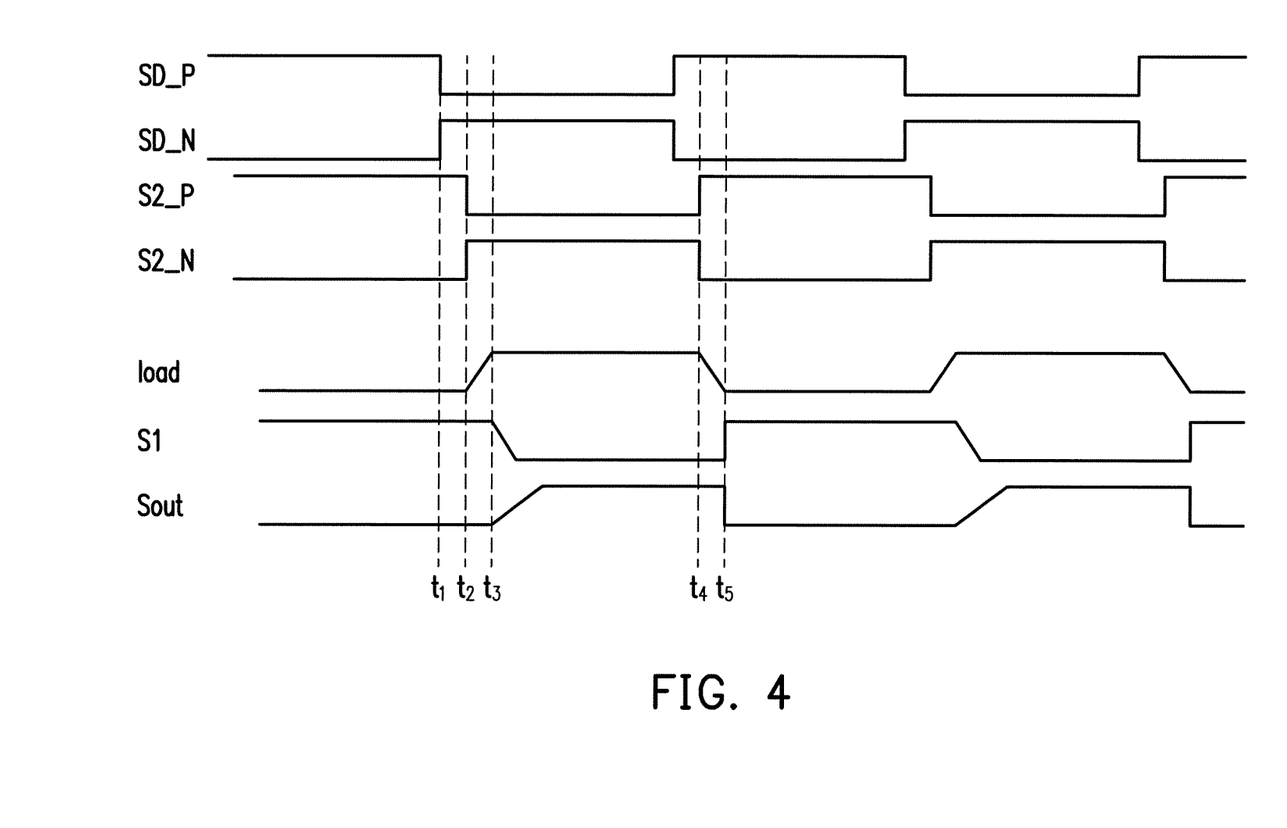
FIG. 4 is a signal time sequence diagram of an overvoltage protection device according to the first embodiment of the invention.

FIG. 4 is a signal time sequence diagram of the overvoltage protection device according to the first embodiment of the invention, which illustrates a transmission process or each of the signals in the overvoltage protection device 200 of FIG. 2. Referring to FIG. 2 and FIG. 4, at a time t1, voltages of the data signals SD_P and SD_N are inversely input to the first buffer 262, respectively. Particularly, phases of the data signals SD_P and SD_N are correlated and inverted to each other. When the first buffer 262 receives the inversely input data signals SD_P and SD_N, the first buffer 262 converts the data signals SD_P and SD_N into second signals S2_P and S2_N wherein the voltage level of the second signals S2_P and S2_N are between 1.8V and 3.3V at time t2, and adjusts or outputs the second signals S2_P and S2_N in a double-end output manner.

At the time t2, after the second buffer 264 receives the adjusted second signals S2_P and S2_N, the second buffer 264 converts the second signals S2_P and S2_N into the first signal S1 at time t3, such that the first signal S1 is changed from a high level to a low level. Moreover, at time t2, the switch 210 conducts the first terminal 210b and the third terminal 210d thereof according to the pulse of the negative second signal S2_N with the high level. At time t2, since the first terminal 210b and the third terminal 210d of the first switch 110 are in the turn-on state, the impedance (or referred to as load) at the control terminal 231a of the first transistor 231 is gradually increased between time t2 and time t3.

At time t3, the second buffer 264 outputs the pulse of the first signal S1 in a single-end manner according to the second signals S2_P and S2_N. Since the load at the control terminal 231a of the first transistor 231 has been increased, the control terminal 231a of the first transistor 231 may receive the first signal S1 which decreased slowly. In this way, a voltage changing amount within a unit of time interval slows down along with the pulse of the first signal S1 received by the first transistor 231, so as to prevent an excessive voltage slew rate. Moreover, the output signal Sout is increased slowly along with the first signal S1.

At time t4, the second signal S2_N is changed from an enable state to a disable state. Therefore, within time t4 and time t5, the first terminal 210b and the third terminal 210d of the first switch 110 are open. At this time, the load at the side of the control terminal 231a of the first transistor 231 is gradually decreased. At time t5, since the load at the side of the control terminal 231a of the first transistor 231 has been decreased, the first signal S1 received by the control terminal 231a of the first transistor 231 is increased quickly, and the output signal Sout is increased quickly along with the first signal S1.

It should be noted that the time difference between the time t2 and the time t3 is not limited by the invention as along as the time t2 is not later than the time t3, i.e. as long as the second signal S2_N may opportunely conducts the first terminal 210b and the third terminal 210d of the first switch 110. Moreover, in other embodiments, any signal not later than the first signal S1 can be used as a signal source for turning on the first terminal 210b and the third terminal 210d of the first switch 110 without being limited to the second signal S2_N.

Figure 5:
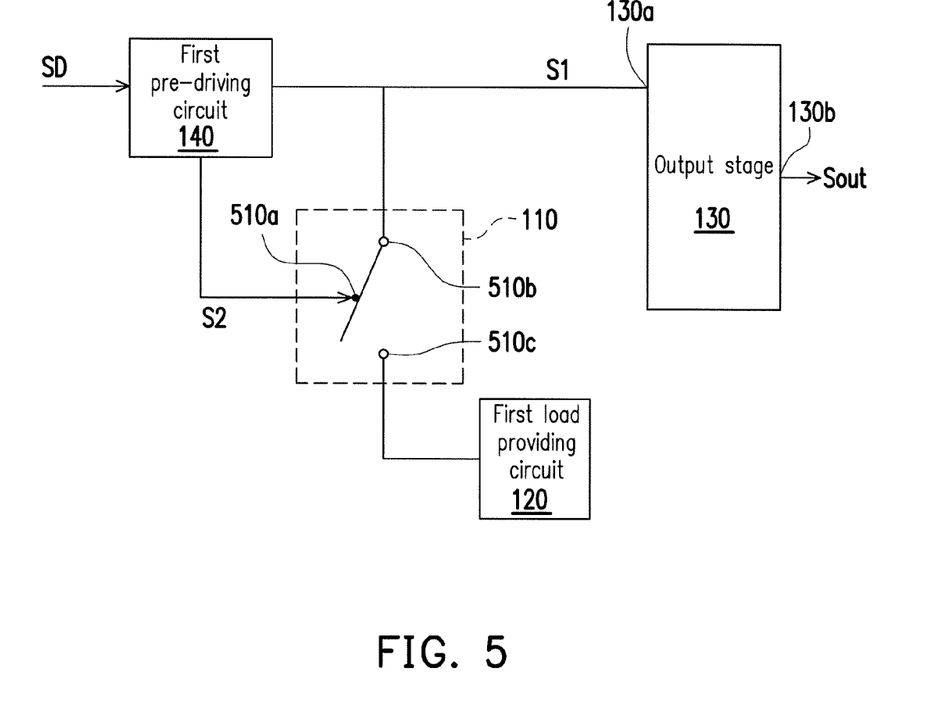
FIG. 5 is a circuit diagram of a first switch according to the first embodiment of the invention.

In a part of the embodiments complied with the spirit of the invention, besides that the first switch 110 can be implemented by a switch circuit structure having four terminals, the first switch 110 can also be implemented by a switch having three terminals. Referring to FIG. 5, FIG. 5 is a circuit diagram of a first switch 510 according to the first embodiment of the invention. The switch 510 has three terminals, which are respectively a control terminal 510a (serving as the control terminal 110a of the first switch 110), a first terminal 510b (serving as the first terminal 110b of the first switch 110) and a second terminal 510c (serving as the second terminal 110c of the first switch). When the control terminal 510a of the first switch 110 receives the enabled second signal S2, the first terminal 510b and the second terminal 510c of the first switch 110 are electrically connected, such that the first terminal 220a of the first capacitor 220 is directly coupled to the first input terminal 130a of the output stage 130. In this way, the first capacitor 220 may increase the impedance at the first input terminal 130a of the output stage 130 through a capacitance coupling effect. On the other hand, when the control terminal 510a of the first switch 110 receives the disabled second signal S2, the first terminal 510b and the second terminal 510c of the first switch 110 are turned off Those skilled in the art may implement the first switch 110 through a plurality of switch circuit structures without being limited by the switch structure mentioned in the present embodiment. Since those skilled in the art may learn enough instructions and recommendations for the other technical contents from the descriptions of FIG. 1 to FIG. 4, detailed description thereof is not repeated.

Figure 6:
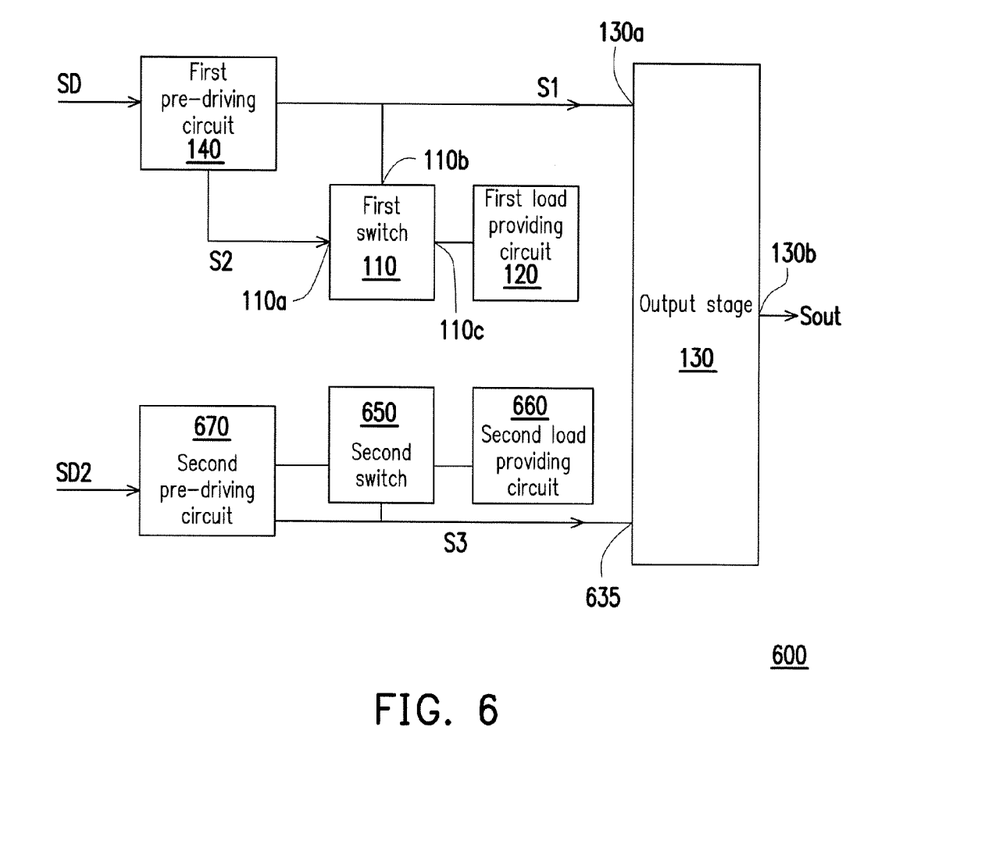
FIG. 6 is a block diagram of an overvoltage protection device according to a second embodiment of the invention.

FIG. 6 is a block diagram of an overvoltage protection device 500 according to a second embodiment of the invention. The first switch 110, the first load providing circuit 120, the output stage 130 and the first pre-driving circuit 140 shown in FIG. 6 have the same functions and same circuit structures with that of FIG. 1, and details thereof are not repeated.

A main difference between the overvoltage protection devices of FIG. 6 and FIG. 1 is that the overvoltage protection device 600 further includes a second switch 650, a second load providing circuit 660 and a second pre-driving circuit 670. In the present embodiment, the second switch 650 has a circuit structure similar with that of the first switch 110, and the second load providing circuit 660 also has a circuit structure similar with that of the first load providing circuit 120. Those skilled in the art may learn enough instructions and recommendations for the second switch 650 and the second load providing circuit 660 from the related descriptions of FIG. 1, and details thereof are not repeated. The second pre-driving circuit 670 is used for delaying the second data signal SD_2 (which is also referred to as a fifth signal) to generate the fourth signal P3.

Figure 7:
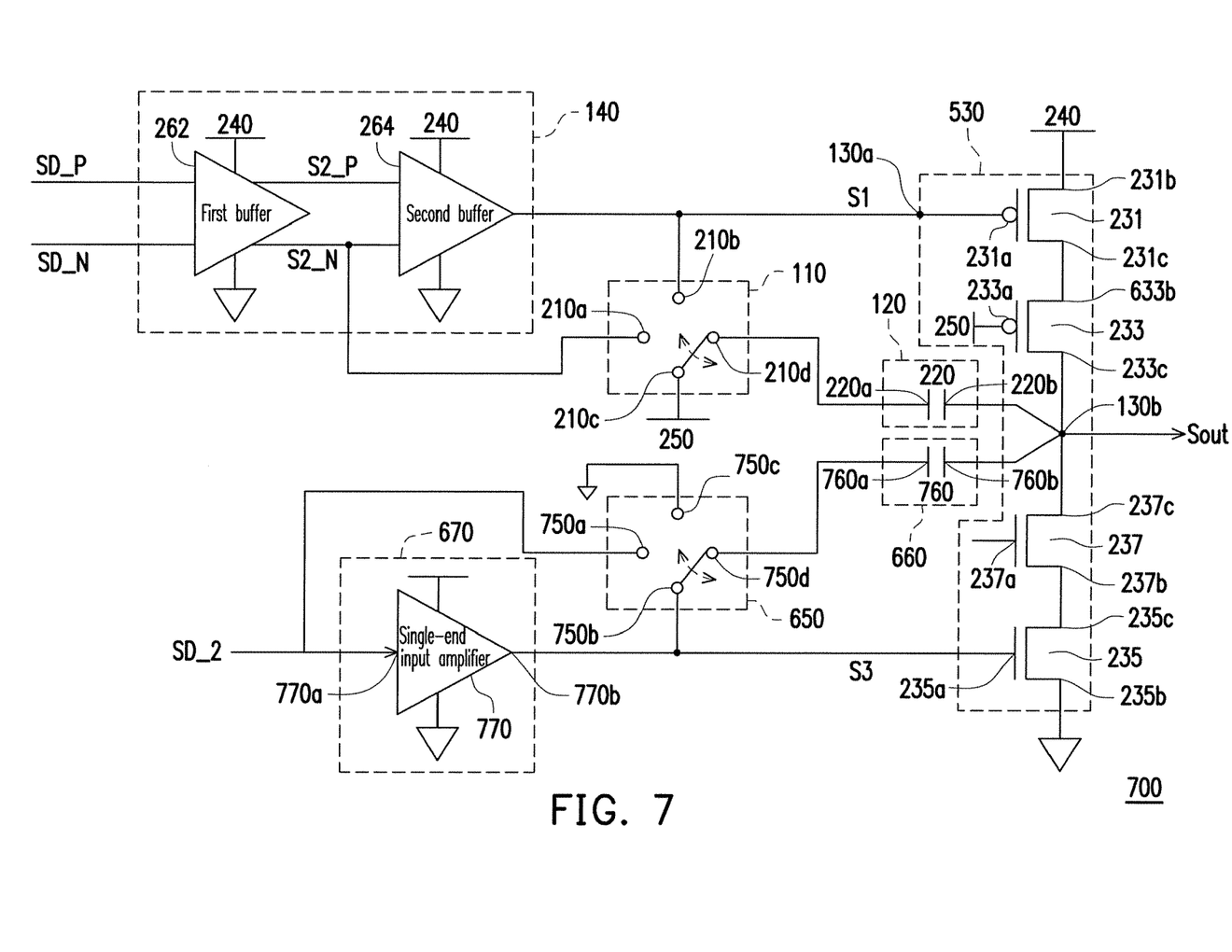
FIG. 7 is a circuit diagram of an overvoltage protection device according to the second embodiment of the invention.

Referring to FIG. 6 and FIG. 7, FIG. 7 is a circuit diagram of an overvoltage protection device according to the second embodiment of the invention. Similar to the circuit schematic diagram of FIG. 2, in the first embodiment and the second embodiment, signal processing performed to the data signals SD_P and SD_N, the second signals S2_P and S2_N and the first signal S1, and implementations of the first NMOS transistor 210, the first capacitor 220, the first transistor 231, the second transistor 233, the third transistor 235, the fourth transistor 237, the first buffer 262 and the second buffer 264 are the same. Those skilled in the art may learn implementations of each of the components in FIG. 6 and FIG. 7 from related description of FIG. 2.

In the circuit structure of the present embodiment, the second switch 650 may include one or a plurality of MOS transistors. In FIG. 7, the second switch 650 is implemented by a switch having four terminals. The second switch 650 has a control terminal 750a (serving as a control terminal of the second switch 650), a first terminal 750b (serving as a first terminal of the second switch 650), a second terminal 750c and a third terminal 750d (serving as a second terminal of the second switch 650). The second load providing circuit 660 is implemented by a second capacitor 760, and has a first terminal 760a and a second terminal 760b. The first terminal 760a of the second capacitor 760 is coupled to the third terminal 750d of the second switch 650, and the second terminal 760b of the second capacitor 760 is coupled to the output terminal 130b of the output stage 130.

It should be noted that in other embodiments of the invention, the second terminal 760b of the second capacitor 760 can be not coupled to the output terminal 130b of the output stage 130, but is coupled to the second terminal 235c of the third transistor 236 or the first terminal 237b of the fourth transistor 237. Namely, the spirit of the invention is met as long as the coupling method of the second capacitor 760 achieves an effect of increasing the impedance to the side of another input terminal of the output stage 130 (i.e. the control terminal 235a of the third transistor 235). Those skilled in the art may adjust the coupling method of the capacitor according to an actual requirement without being limited by the coupling method of the invention.

In the present embodiment, a signal transmission method of the second data signal SD_2 and the fourth signal S3 among the second NMOS transistor 750, the second capacitor 760, the third transistor 235 and the fourth transistor 237 is similar to the signal transmission method of the second signals S2_P and S2_N and the first signal S1 among the first NMOS transistor 210, the first capacitor 220, the first transistor 231 and the second transistor 233. In the present embodiment, the second data signal SD_2 can be used as a signal source for turning on the first terminal 750b and the third terminal 750d of the second switch 650. To be specific, when the second data signal SD_2 is disabled (in the present embodiment, the second data signal SD_2 with a high level is received), the first terminal 750b and the third terminal 750d of the second switch 650 are in the open condition, and the second terminal 750c and the third terminal 750d of the second switch 650 are in a short condition, such that the first terminal 760a of the second capacitor 760 is coupled to ground. However, when the second data signal SD_2 is enabled (in the present embodiment, the second data signal SD_2 with a low level is received), the second data signal SD_2 with the low level may turn on the first terminal 750b and the third terminal 750d of the second switch 650, such that the first terminal 760a of the second capacitor 760 is coupled to the control terminal 235a of the third transistor 235, and the first capacitor 220 may temporarily increase the impedance at the first input terminal 130a of the output stage 130. Description of other technical contents may refer to related description of the aforementioned embodiment.

The second pre-driving circuit 670 of FIG. 7 can be unnecessary to adjust a signal voltage level. To be specific, the second pre-driving circuit 670 is implemented by a single-end input amplifier 770, so that the second pre-driving circuit 670 has an input terminal 770a and an output terminal 770b. The input terminal 770a of the single-end input amplifier 770 receives the second data signal SD_2, and a power terminal of the single-end input amplifier 770 receives the system voltage. The single-end input amplifier 770 delays the second data signal SD_2, and executes a NOT gate operation to the second data signal SD_2 to generate the fourth signal S3, and outputs the fourth signal S3 in the single-end manner. Now, voltage levels of the second data signal SD_2 and the fourth signal S3 are clamped between 0V and 1.8V, and the single-end input amplifier 770 is unnecessary to adjust the signal voltage level.

Figure 8:
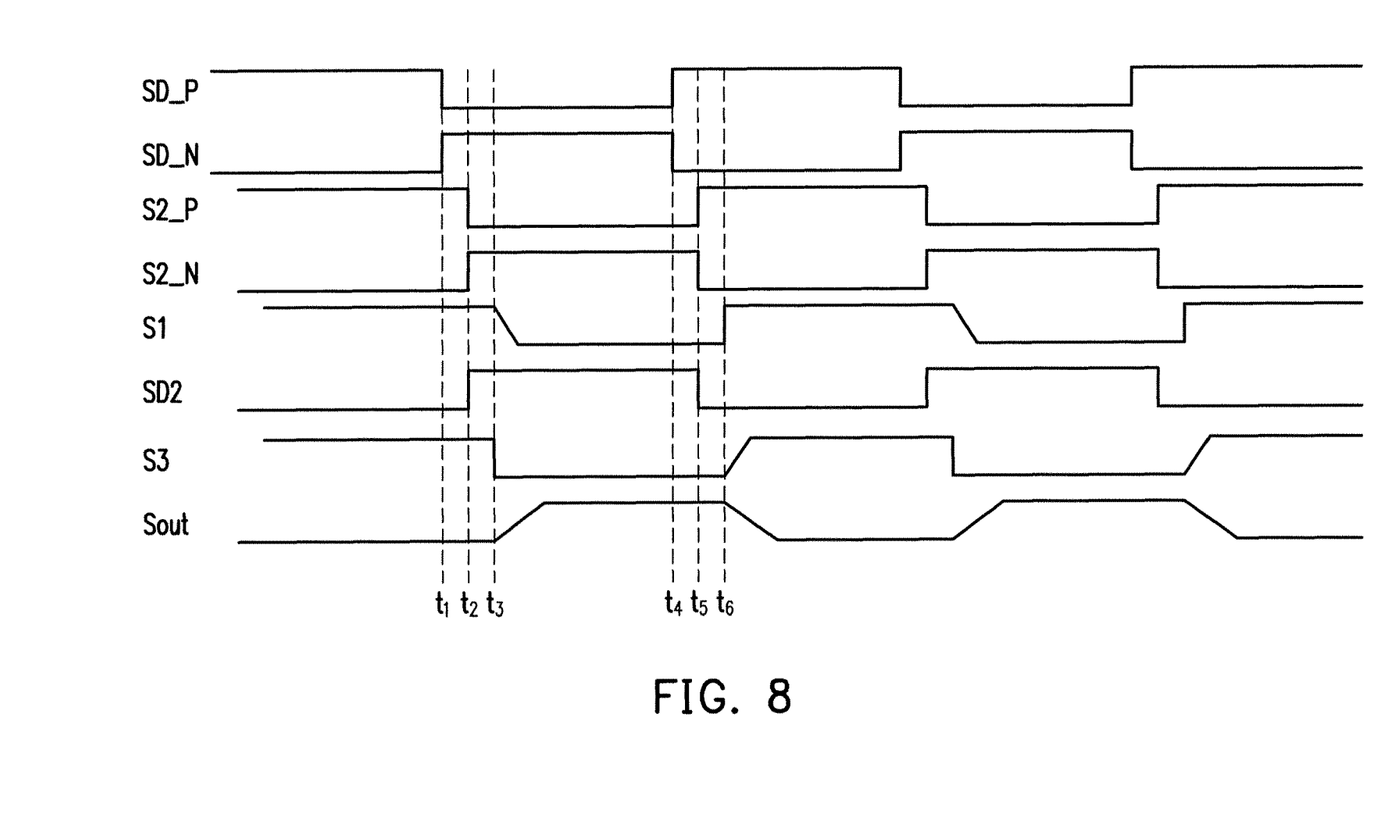
FIG. 8 is a signal time sequence diagram of an overvoltage protection device according to the second embodiment of the invention.

During a complete signal transmission process, referring to FIG. 7 and FIG. 8, FIG. 8 is a signal time sequence diagram of an overvoltage protection device according to the second embodiment of the invention. Since processing of the data signals SD_P, SD_N and the second data signal SD_2 are independent, signal timings of the data signals SD_P, SD_N and the first signal S1, the second signals S2_P and S2_N are the same with that of FIG. 6. Operations of a part of components of in the second switch 650, the single-end input amplifier 770 and the output stage 130 are disclosed below.

At time t2, the single-end input amplifier 770 receives the inversely input second data signal SD_2. At time t3, the single-end input amplifier 770 delays the second data signal SD_2, and executes a NOT gate operation to the second data signal SD_2, so as to output an inverted fourth signal S3. At time t4, since the second data signal SD_2 is in a low level, the first terminal 750b and the third terminal 750d of the second switch 650 are in the short condition. Now, the load at the side of the control terminal 237a of the fourth transistor 237 is increased, such that the fourth signal S3 is slowly increased between the time t4 and the time t5, and the output signal Sout is slowly decreased.

In summary, in the overvoltage protection device of the invention, the first switch and the first load providing circuit used for temporarily increasing an impedance are added before the output stage. In this way, when a data signal (for example, the second signal) is transmitted through the overvoltage protection device, the data signal can be delayed to generate the first signal, and the second signal is adopted to turn on the first switch, such that the first load providing circuit is adapted to increase a input terminal impedance of the output stage when the first switch is turned on. Moreover, after the input terminal impedance is increased, the delayed first signal is transmitted to the output terminal of the output stage. In this way, a voltage slew time of the data signal is delayed when the data signal passes through the output stage, so as to avoid the electromagnetic interference. Moreover, through the pre-driving circuit of the invention, the voltage level of signal can be effectively adjusted, such that the output voltage is complied the standard specifications of USB interface.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An overvoltage protection device, comprising:
    an output stage, having a first input terminal to receive a first signal, and generating an output signal at an output terminal of the output stage according to the first signal;
    a first switch, having a first terminal coupled to the first input terminal of the output stage, and a control terminal receiving a second signal, wherein a time for the control terminal of the first switch receiving the second signal is not later than a time for the first input terminal receiving the first signal;
    a first load providing circuit, coupled to a second terminal of the first switch; and
    a first pre-driving circuit, coupled to the first input terminal of the output stage and the control terminal of the first switch, and delaying the second signal to generate the first signal,
    wherein the first load providing circuit provides an impedance to the first input terminal when the first switch is turned on.

2. The overvoltage protection device as claimed in claim 1, wherein the first pre-driving circuit comprises:
    a first buffer, receiving a third signal in a first voltage level, and generating the second signal in a second voltage level; and
    a second buffer, receiving and delaying the second signal to generate the first signal, wherein the first signal is in the second voltage level.

3. The overvoltage protection device as claimed in claim 2, wherein the first buffer and the second buffer are differential amplifiers, wherein each differential amplifier comprises:
    an input transistor pair, coupled to a reference current source, and providing a pair of input terminals to receive a differential signal pair;
    a bias-controlled transistor pair, coupled to the input transistor pair, and receiving a bias control voltage respectively; and a resistive element pair, coupled to the bias-controlled transistor pair and the system voltage terminal, and generating a single-end or double-end output signal according to the differential signal pair.

4. The overvoltage protection device as claimed in claim 1, wherein the output stage comprises:
   a first transistor, having a control terminal serving as the first input terminal of the output stage, and a first terminal coupled to a system voltage terminal; and
   a second transistor, having a first terminal coupled to a second terminal of the first transistor, a control terminal coupled to a first reference voltage, and a second terminal serving as the output terminal of the output stage.

5. The overvoltage protection device as claimed in claim 1, wherein the first load providing circuit comprises:
   a first capacitor, having a first terminal coupled to the second terminal of the first switch, and a second terminal coupled to the output terminal of the output stage.

6. The overvoltage protection device as claimed in claim 1, wherein when the second signal is disabled, the first switch couples a first terminal of the first load providing circuit to the system voltage terminal,
   when the second signal is enabled, the first switch couples the first terminal of the first load providing circuit to the first input terminal of the output stage.

7. The overvoltage protection device as claimed in claim 1, wherein when the second signal is disabled, the first switch turns off the conduction between a first terminal of the first load providing circuit and the first input terminal of the output stage,
   when the second signal is enabled, the first switch couples the first terminal of the first load providing circuit to the first input terminal of the output stage.

8. The overvoltage protection device as claimed in claim 7, wherein the output stage further comprises:
   a third transistor, having a control terminal serving as the second input terminal of the output stage, and a first terminal coupled to ground; and
   a fourth transistor, having a first terminal coupled to a second terminal of the third transistor, a control terminal coupled to a second reference voltage, and a second terminal coupled to the output terminal of the output stage.

9. The overvoltage protection device as claimed in claim 7, wherein the second load providing circuit comprises:
   a second capacitor, having a first terminal coupled to the second terminal of the second switch, and a second terminal coupled to the output terminal of the output stage.

10. The overvoltage protection device as claimed in claim 7, wherein when the fifth signal is disabled, the second switch couples the first terminal of the second load providing circuit to ground,
    when the fifth signal is enabled, the second switch couples the first terminal of the second load providing circuit to the second input terminal of the output stage.

11. The overvoltage protection device as claimed in claim 1, wherein the output stage further comprises a second input terminal to receive a fourth signal, and
    the overvoltage protection device further comprises:
    a second switch, having a first terminal coupled to the second input terminal of the output stage, and a control terminal receiving a fifth signal, wherein the fourth signal is the delayed fifth signal; and
    a second load providing circuit, coupled to a second terminal of the second switch,
    wherein the second load providing circuit provides an impedance to the second input terminal when the second switch is turned on.

12. The overvoltage protection device as claimed in claim 11, further comprising:
    a second pre-driving circuit, coupled to the second input terminal of the output stage and the control terminal of the second switch, and delaying the fifth signal to generate the fourth signal.

13. The overvoltage protection device as claimed in claim 11, wherein the second pre-driving circuit is a single-end input amplifier,
    wherein an input terminal of the single-end input amplifier receives the fifth signal, a power terminal of the single-end input amplifier receives a system voltage, and an output terminal of the single-end input amplifier outputs the fourth signal in a single-end manner according to the fifth signal.

* * * * *